(12) United States Patent
Chilton et al.

(10) Patent No.: US 8,010,738 B1
(45) Date of Patent: Aug. 30, 2011

(54) TECHNIQUES FOR OBTAINING A SPECIFIED LIFETIME FOR A DATA STORAGE DEVICE

(75) Inventors: Kendell A. Chilton, Southborough, MA (US); Sachin More, Northborough, MA (US)

(73) Assignee: EMC Corporation, Hopkinton, MA (US)

( * ) Notice: Subject to any disclaimer, the term of this patent is extended or adjusted under 35 U.S.C. 154(b) by 546 days.

(21) Appl. No.: 12/215,432

(22) Filed: Jun. 27, 2008

(51) Int. Cl.
*G06F 12/00* (2006.01)
*G11C 29/42* (2006.01)

(52) U.S. Cl. ............ 711/103; 711/112; 711/154; 714/1; 714/773

(58) Field of Classification Search .................. None
See application file for complete search history.

(56) References Cited

U.S. PATENT DOCUMENTS

| | | | |
|---|---|---|---|
| 5,206,939 A | 4/1993 | Yanai et al. | |
| 5,778,394 A | 7/1998 | Galtzur et al. | |
| 5,845,147 A | 12/1998 | Vishlitzky et al. | |
| 5,857,208 A | 1/1999 | Ofek | |
| 6,119,245 A * | 9/2000 | Hiratsuka | 714/6.11 |
| 7,047,366 B1 | 5/2006 | Ezra | |
| 7,809,900 B2 * | 10/2010 | Danilak | 711/154 |
| 2006/0274445 A1 * | 12/2006 | Hobbet et al. | 360/75 |
| 2007/0136522 A1 * | 6/2007 | Umemura et al. | 711/113 |
| 2007/0143539 A1 * | 6/2007 | Ichikawa | 711/113 |
| 2008/0082726 A1 * | 4/2008 | Elhamias | 711/103 |
| 2008/0086275 A1 * | 4/2008 | Astigarraga et al. | 702/34 |
| 2009/0113123 A1 * | 4/2009 | Joukov | 711/112 |
| 2009/0204852 A1 * | 8/2009 | Diggs et al. | 714/42 |
| 2009/0300277 A1 * | 12/2009 | Jeddeloh | 711/104 |

OTHER PUBLICATIONS

Mielke et al. (Bit Error Rate in NAND Flash memories, pp. 9-19; published Apr. 27, 2008-May 1, 2008, by IEEE).*
U.S. Appl. No. 11/254,089, filed Oct. 19, 2005, Yochai, et al.

* cited by examiner

*Primary Examiner* — Kaushikkumar Patel
(74) *Attorney, Agent, or Firm* — Muirhead and Saturnelli, LLC

(57) ABSTRACT

Described are techniques for processing requests for a device. One embodiment is directed to a method including receiving a first value indicating an expected usage of said device prior to failure of said device, receiving a second value indicated a specified lifetime of said device, said second value being in units of time, determining a target rate of usage for the device in accordance with said first value and said second value, determining a current rate of usage for the device, determining whether the current rate of usage is greater than the target rate of usage; and, if said current rate of usage is greater than the target rate of usage, performing an action to reduce the current rate of usage for the device.

20 Claims, 8 Drawing Sheets

| Bit failures in device | Predicted number of cumulative writes |
|---|---|
| 100 | N |
| .. .. | .. .. |
| 1000 | 3*N |
| .. .. | .. .. |

FIG. 3

TECHNIQUES FOR OBTAINING A SPECIFIED LIFETIME FOR A DATA STORAGE DEVICE

BACKGROUND

1. Technical Field

This application generally relates to data storage, and more particularly to techniques used in connection with obtaining a specified lifetime for a data storage device.

2. Description of Related Art

Computer systems may include different resources used by one or more host processors. Resources and host processors in a computer system may be interconnected by one or more communication connections. These resources may include, for example, data storage devices such as those included in the data storage systems manufactured by EMC Corporation. These data storage systems may be coupled to one or more host processors and provide storage services to each host processor. Multiple data storage systems from one or more different vendors may be connected and may provide common data storage for one or more host processors in a computer system.

A host processor may perform a variety of data processing tasks and operations using the data storage system. For example, a host processor may perform basic system I/O operations in connection with data requests, such as data read and write operations.

Host processor systems may store and retrieve data using a storage device containing a plurality of host interface units, disk drives, and disk interface units. Such storage devices are provided, for example, by EMC Corporation of Hopkinton, Mass. and disclosed in U.S. Pat. No. 5,206,939 to Yanai et al., 5,778,394 to Galtzur et al., U.S. Pat. No. 5,845,147 to Vishlitzky et al., and U.S. Pat. No. 5,857,208 to Ofek. The host systems access the storage device through a plurality of channels provided therewith. Host systems provide data and access control information through the channels to the storage device and storage device provides data to the host systems also through the channels. The host systems do not address the disk drives of the storage device directly, but rather, access what appears to the host systems as a plurality of logical disk units, logical devices, or logical volumes (LVs). The logical disk units may or may not correspond to the actual disk drives. Allowing multiple host systems to access the single storage device unit allows the host systems to share data stored therein.

In connection with data storage, a variety of different technologies may be used. Data may be stored on disk devices (as described above), tape devices and flash memory devices, such as USB devices. Different storage technologies, such as a flash memory device, may fail primarily due to wear out or usage, such as after performing a certain number of write cycles to store data on the flash memory device. For example, a flash memory device that uses NAND flash memory and is an SLC (single level cell) device is expected to perform a specified number of writes to a cell. After performing the specified number of writes to the cell, that cell is expected to fail when attempting to subsequently write data thereto. As such, different techniques may be used when writing to the flash memory device. One technique is to use an error correction code (ECC) to allow recovery of data upon the occurrence of a write failure. Another technique is wear leveling which attempts to balance or evenly distribute writes across the physical device locations. Thus, when performing a write operation to a flash memory device, the write operation may be performed to a logical location on the device which is then mapped to a physical location on the device. With wear leveling and flash memory devices, the particular physical location for the same logical location may change in accordance with a mapping of virtual to physical locations in order to achieve the desired equal distribution of writes across physical locations of the device. The foregoing is one example of a data storage technology and cause of wear out where the device may be expected to fail after a specified amount of usage.

SUMMARY OF THE INVENTION

In accordance with one aspect of the invention is a method for processing requests for a device comprising: receiving a first value indicating an expected usage of said device prior to failure of said device; receiving a second value indicated a specified lifetime of said device, said second value being in units of time; determining a target rate of usage for the device in accordance with said first value and said second value; determining a current rate of usage for the device; determining whether the current rate of usage is greater than the target rate of usage; and if said current rate of usage is greater than the target rate of usage, performing an action to reduce the current rate of usage for the device. The device may be a flash memory device, the first value may indicate a number of writes or erasures expected with respect to the flash memory device, or a portion thereof, prior to failure of the flash memory device, and the current usage rate may be determined by measuring a number of writes or erasures performed to said device, or a portion thereof, in a given time period. The action may include injecting one or more time delays in connection with one or more subsequent write requests. Upon determining that said current rate of usage is greater than the target rate of usage, the method may further include holding a write request at a host for a time prior to sending the write request to a data storage system including the device for processing. The device may be included in a data storage system, and, upon determining that said current rate of usage is greater than the target rate of usage, the method may further include modifying an amount of a resource of a data storage system allocated for use in connection with write requests for said device. Upon determining that said current rate of usage is greater than the target rate of usage, the method may include delaying destaging data for a write request included in a cache to said device. Upon determining that said current rate of usage is greater than the target rate of usage, the method may include delaying sending a response for a write request to a host that issued said write request. The method may also include: revising said first value to a revised first value that is less than said first value; determining a revised target rate of usage for the device in accordance with said revised first value and said second value; and using said revised target rate of usage in place of said target rate of usage when performing said determining whether the current rate of usage is greater than the target rate of usage. The step of determining said current rate of usage at a first point in time for said device may also include gathering a first set of data indicating a first characteristic of said device, said first characteristic being an indicator as to an amount of usage of said device at said first point in time; determining, in accordance with said first set of data, a first characteristic value associated with the first characteristic; and determining, in accordance with said first characteristic value and a set of predicted data, a usage value indicating a predicted usage of said device indicating an amount of cumulative usage of said device to said first point in time. The usage value may be used in determining said current rate of usage for the device. The device may be a flash memory device, and the first characteristic value may indicate a number of errors in connection with performing erasures or writes to said device, or portion thereof, and the set of predicted data may indicate a plurality of predicted number of erasures or writes performed with respect to the device, or portion thereof, in accordance with a plurality of corresponding first characteristic values. The device may be a disk drive, the first value may indicate a number of times the device is expected to be spun up and/or spun down prior to failure, and the current usage rate may indicate a number of times the device has been spun up and/or down in a given time period. The second value may be used in determining a numeric value representing an availability of a data storage system including said device. The second value may represent a mean time to fail for said device. The second value may represent a mean time between failures for said device. The action may include at least one of: decreasing a rate at which erasures are performed with respect to said device, or portion thereof, and decreasing a rate at which writes are performed with respect to said device, or portion thereof.

In accordance with another aspect of the invention is a data storage system comprising: a first flash memory device wherein a number of writes or erasures W1 is expected to be performed to the first flash memory device prior to failure of said first flash memory device; a second flash memory device wherein a number of writes or erasures W2 is expected to be performed to the second flash memory device prior to failure of said second flash memory device, W2>W1; a first computer readable storage medium comprising executable code stored thereon for determining target performance rates for said first flash memory device and said second flash memory device so that said first flash memory device and said second flash memory device have a same specified lifetime, said first computer readable storage medium comprising executable code stored thereon for: determining a first target performance rate for said first flash memory device in accordance with W1 and a value indicating a specified lifetime in units of time; and determining a second target performance rate for said second flash memory device in accordance with W2 and said value indicating a specified lifetime in units of time; and a second computer readable storage medium comprising executable code stored thereon for: determining a current performance rate for one of said first flash memory device and said second flash memory device; determining whether said current performance rate for said one flash memory device is greater than a target performance rate for said one flash memory device; and if said current performance rate is greater than the target performance rate, performing an action to reduce the current performance rate. The action may include at least one of: decreasing a rate at which erasures are performed with respect to said device, or portion thereof, and decreasing a rate at which writes are performed with respect to said device, or portion thereof.

In accordance with another aspect of the invention is a method for obtaining a desired lifetime of an entity comprising: receiving a first value indicating an expected usage of said entity prior to failure of said entity; receiving a second value indicated a specified lifetime of said entity, said second value being in units of time; determining a target rate of usage for the entity in accordance with said first value and said second value; determining a current rate of usage for the entity; determining whether the current rate of usage is greater than the target rate of usage; and if said current rate of usage is greater than the target rate of usage, performing an action to reduce the current rate of usage for the entity. The entity may be a first entity and the steps of said method may be performed for said first entity and the method steps may also be performed for a second entity so that said first entity and said second entity have said specified lifetime.

BRIEF DESCRIPTION OF THE DRAWINGS

Features and advantages of the present invention will become more apparent from the following detailed description of exemplary embodiments thereof taken in conjunction with the accompanying drawings in which:

FIG. 3 is an example illustrating a table of data that may be used in determining a predicted number of cumulative writes in an embodiment performing the techniques herein;

DETAILED DESCRIPTION OF
EMBODIMENT(S)

Figure 1:
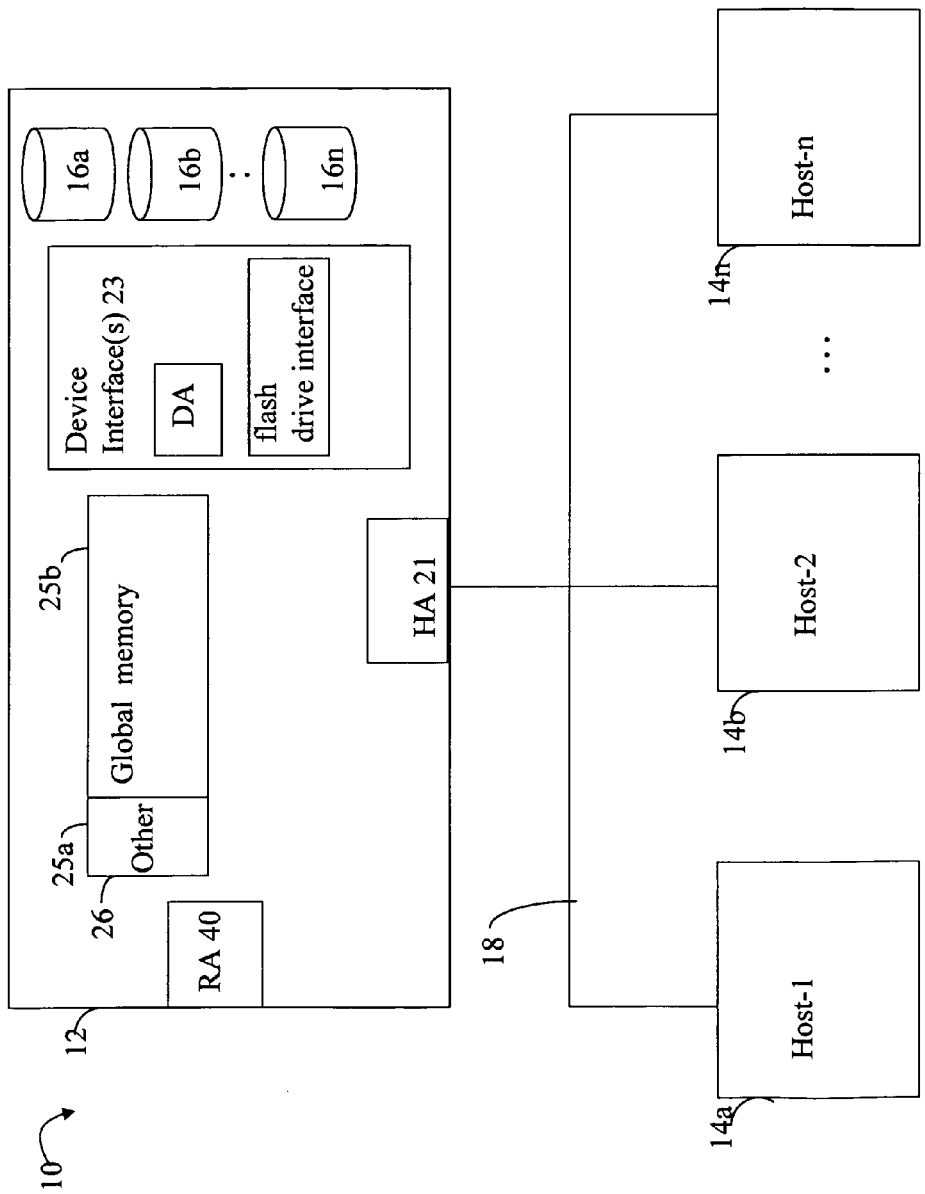
FIG. 1 is an example of an embodiment of a computer system that may utilize the techniques described herein.

Referring to FIG. 1, shown is an example of an embodiment of a system that may be used in connection with performing the techniques described herein. The system 10 includes a data storage system 12 connected to host systems 14a-14n through communication medium 18. In this embodiment of the computer system 10, and the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols such as SCSI, Fibre Channel, iSCSI, and the like. Some or all of the connections by which the hosts and data storage system may be connected to the communication medium may pass through other communication devices, such as a Connectrix or other switching equipment that may exist such as a phone line, a repeater, a multiplexer or even a satellite.

Each of the host computer systems may perform different types of data operations in accordance with different types of tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN (storage array network), in an embodiment using the techniques herein. It should also be noted that an embodiment may include data storage arrays or other components from one or more vendors. In subsequent examples illustrated the techniques herein, reference may be made to a single data storage array by a vendor, such as by EMC Corporation of Hopkinton, Mass. However, as will be appreciated by those skilled in the art, the techniques herein are applicable for use with other data storage arrays by other vendors and with other components than as described herein for purposes of example.

The data storage system 12 may be a data storage array including a plurality of data storage devices 16a-16n. The data storage devices 16a-16n may include one or more types of data storage devices such as, for example, one or more disk drives and/or one or more solid state drives (SSDs). An SSD is a data storage device that uses solid-state memory to store persistent data. An SSD using SRAM or DRAM, rather than flash memory, may also be referred to as a RAM drive. SSD may refer to solid state electronics devices as distinguished from electromechanical devices, such as hard drives, having moving parts. Flash drives or flash memory-based SSDs are one type of SSD that contains no moving parts. As described in more detail in following paragraphs, the techniques herein may be used in an embodiment in which one or more of the devices 16a-16n are flash drives.

The data storage array may also include different types of adapters or directors, such as an HA 21 (host adapter), RA 40 (remote adapter), and/or device interface 23. Each of the adapters may be implemented using hardware including a processor with local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The data storage array may include one or more RAs that may be used, for example, to facilitate communications between data storage arrays. The data storage array may also include one or more device interfaces 23 for facilitating data transfers to/from the data storage devices 16a-16n. The data storage interfaces 23 may include device interface modules, for example, one or more disk adapters (DAs) (e.g., disk controllers), adapters used to interface with the flash drives, and the like. One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, HAs and/or RAs in a data storage array. In one embodiment, the device interfaces 23 may perform data operations using a cache that may be included in the global memory 25b, for example, when communicating with other device interfaces and other components of the data storage array. The other portion 25a is that portion of memory that may be used in connection with other designations that may vary in accordance with each embodiment.

The particular data storage system as described in this embodiment, or a particular device thereof, such as a disk or particular aspects of a flash drive, should not be construed as a limitation. Other types of commercially available data storage systems, as well as processors and hardware controlling access to these particular devices, may also be included in an embodiment.

Host systems provide data and access control information through channels to the storage systems, and the storage systems may also provide data to the host systems also through the channels. The host systems do not address the drives or devices 16a-16n of the storage systems directly, but rather access to data may be provided to one or more host systems from what the host systems view as a plurality of logical devices or logical volumes (LVs). The LVs may or may not correspond to the actual physical devices or drives 16a-16n. For example, one or more LVs may reside on a single physical drive or multiple drives. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may be one type of device interface used in connection with facilitating data transfers to/from the associated disk drive(s) and LV(s) residing thereon. A flash drive interface may be another type of device interface used in connection with facilitating data transfers to/from the associated flash drives and LV(s) residing thereon. It should be noted that an embodiment may use a same device interface for one or more different types of devices than as described herein.

The device interface, such as a DA, performs I/O operations on a drive 16a-16n. In the following description, data residing on an LV may be accessed by the device interface following a data request in connection with I/O operations that other directors originate. Data may be accessed by LV in which a single device interface manages data requests in connection with the different one or more LVs that may reside on a drive 16a-16n. For example, a device interface may be a DA that accomplishes the foregoing by creating job records for the different LVs associated with a particular device. These different job records may be associated with the different LVs in a data structure stored and managed by each device interface.

Figure 2:
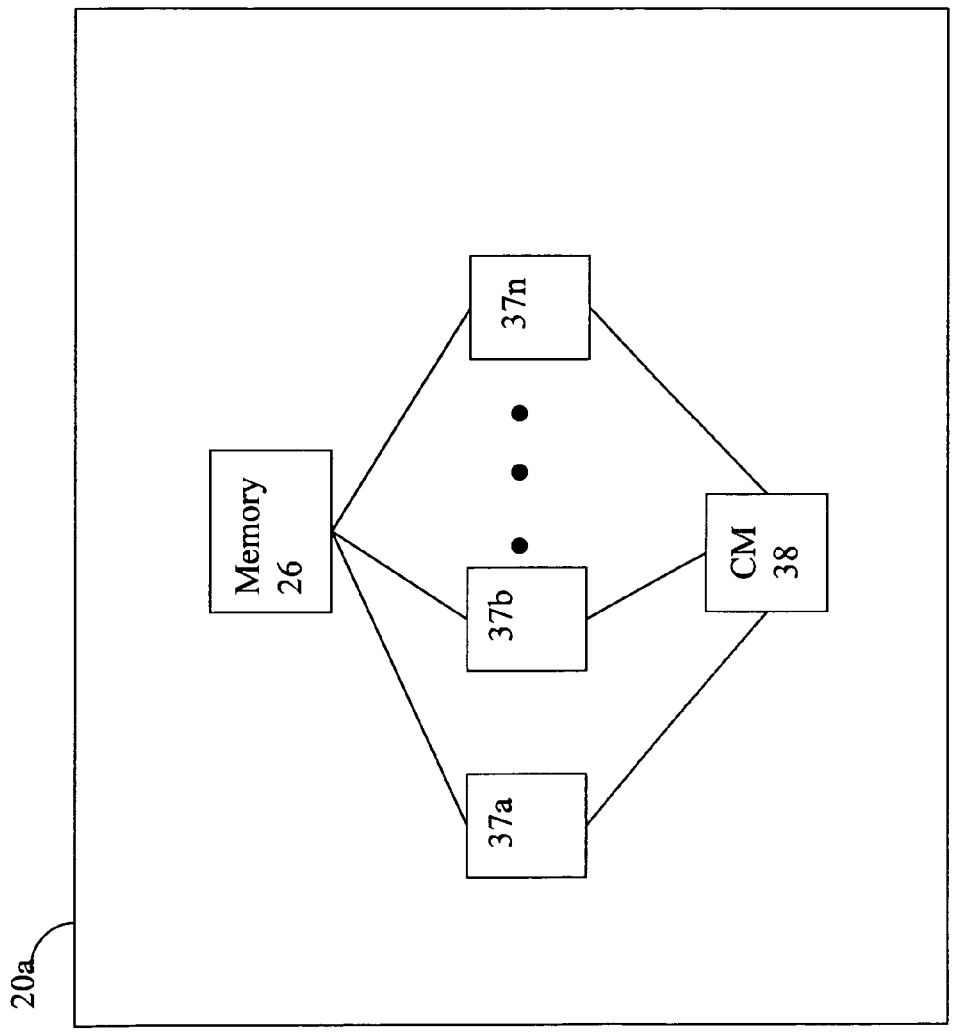
FIG. 2 is a representation of the logical internal communications between the directors and memory included in one embodiment of data storage system of FIG. 1.

Referring to FIG. 2, shown is a representation of the logical internal communications between the directors and memory included in a data storage system. Included in FIG. 2B is a plurality of directors 37a-37n coupled to the memory 26. Each of the directors 37a-37n represents one of the HA's, RA's, or device interfaces that may be included in a data storage system. In an embodiment disclosed herein, there may be up to sixteen directors coupled to the memory 26. Other embodiments may allow a maximum number of directors other than sixteen as just described and the maximum number may vary with embodiment.

The representation of FIG. 2 also includes an optional communication module (CM) 38 that provides an alternative communication path between the directors 37a-37n. Each of the directors 37a-37n may be coupled to the CM 38 so that any one of the directors 37a-37n may send a message and/or data to any other one of the directors 37a-37n without needing to go through the memory 26. The CM 38 may be implemented using conventional MUX/router technology where a sending one of the directors 37a-37n provides an appropriate address to cause a message and/or data to be received by an intended receiving one of the directors 37a-37n. In addition, a sending one of the directors 37a-37n may be able to broadcast a message to all of the other directors 37a-37n at the same time.

With reference back to FIG. 1, components of the data storage system may communicate using GM 25b. For example, in connection with returning data to a host from one of the devices as part of a read operation, the data may be copied from the device by the appropriate device interface, such as a DA servicing the device. The device interface may copy the data read into a cache slot included in GM which is, in turn, communicated to the appropriate HA in communication with the host.

As described above, the data storage system 12 may be a data storage array including a plurality of data storage devices 16a-16n in which one or more of the devices 16a-16n are flash drives. In one embodiment, the data storage system 12 may be a Symmetrix® DMX™ data storage array by EMC Corporation of Hopkinton, Mass. In the foregoing data storage array, the data storage devices 16a-16n may include a combination of disk drives and flash drives in which the flash drives may appear as standard Fibre Channel drives to the various software tools used in connection with the data storage array. The flash drives may be optimized for write longevity using a variety of different techniques known in the art, such as wear leveling. Wear leveling may be characterized as a technique that attempts to arrange or store data on the flash drive where erasures and rewrites are evenly distributed so that no single cell prematurely fails due to a high concentration of writes. Additionally, a data storage array may utilize some techniques in connection with flash drives, other SSDs, and also disks. For example, bad blocks, or other portions of a drive may be mapped out so that once discovered, they are not subsequently used for storing data. Techniques such as wear leveling and mapping out bad blocks or other bad data portions may be used in combination with the techniques described herein in following paragraphs for flash drives. The flash drives may be constructed using nonvolatile semiconductor NAND flash memory. The flash drive may be an SLC (single level cell) device.

It should be noted that the techniques herein may be used in connection with flash drives comprising what may be characterized as enterprise-grade or enterprise-class flash drives with an expected lifetime (e.g., as measured in an amount of actual elapsed time such as a number of years, months, and/or days) based on a number of guaranteed write cycles and a rate or frequency at which the writes are performed. Thus, a flash drive may be expected to have a usage measured in calendar or wall clock elapsed time based on the amount of time it takes to perform the number of guaranteed write cycles. The techniques herein may also be used with other flash drives, more generally referred to as non-enterprise class flash drives, which, when performing writes at a same rate as for enterprise class drives, may have a lower expected lifetime based on a lower number of guaranteed write cycles. As described in more detail elsewhere herein, the techniques herein may be used to prolong the expected lifetime of a non-enterprise-class flash drive that may be included in a data storage array by controlling the rate or frequency of write operations to a flash drive. More generally, the techniques herein may be used to ensure that any type of flash drive lasts for a specified amount of time (e.g., a required or specified lifetime) by controlling the number of write operations which are allowed to occur in a time interval. As an example, flash drive A may be guaranteed to withstand a number of write cycles or successful writes W1 to the drive. Based on a rate R1 of a number of write operations performed in a given time period (e.g., such as an expected usage rate of a number of write operations per day, per week, per month, annually, and the like), flash drive A may have an expected lifetime of T1 where T1 is measured in units of time. Flash drive B may use a different type of flash memory guaranteed to withstand a number of write cycles or successful writes W2 to the drive B, where W1>W2. Based on the same rate R1, flash drive B may have an expected lifetime of T2, where T1>T2. Using the techniques herein, the lifetime of flash drive B may be extended to be T1, the same as flash drive A, by controlling or restricting the rate at which write operations are performed with respect to the flash drive B. Using the techniques herein, the write performance or rate at which write operations are performed (e.g., number of write operations allowed in a given time period) for flash drive B may be artificially restricted without modifying or otherwise controlling the read performance for flash drive B. As described in more detail in following paragraphs, a number of writes made to flash drive B over a time period (e.g., actual write performance of flash drive B) may be determined, such as through gathering actual performance data. A number of subsequently allowed write operations for drive B in a given time period may be adjusted as needed to achieve the desired lifetime T1 based on the actual write performance. Thus, in one embodiment, the data storage array 12 may include flash drive B as just described and the techniques herein may be used to control write performance for flash drive B so that flash drive B has a same lifetime as flash drive A. An embodiment may also include flash drive A as just described, and the techniques herein may be used to control write performance to flash drive A to further extend the lifetime of flash drive A beyond T1 or to some other specified lifetime.

The techniques herein may be generally used in connection with any type of flash drive in order to ensure that the flash drive lasts a specified lifetime. The flash drive may be, for example, a flash drive which is a NAND gate flash device, NOR gate flash device, flash device that uses SLC or MLC (multi-level cell) technology, and the like, as known in the art. As known in the art, MLC, in contrast to SLC, stores more than 1 bit per cell.

More generally, the techniques herein may be used to adjust the write performance or rate at which write operations are performed for any type of storage device (e.g., flash-based, other type of SSD, or otherwise) in order to ensure that the device has a specified lifetime if the lifetime can be determined as a function of a number of guaranteed write operations (e.g., if the lifetime is based upon, or primarily dependent upon, a number of write cycles to the device). Similarly, the techniques herein may be used to adjust the performance or rate of other types of operations besides write operations that may affect the lifetime of a device. Furthermore, the techniques herein may be used to adjust operations affecting device usage of any type of device where the device has wear out or fails primarily due to a specified level of usage having been performed. By controlling operations or conditions that are known to cause device wear out leading to device failure, a specified lifetime of a device may be predictably attainable.

In following paragraphs, reference may be made to examples in which the techniques herein are applied to a flash drive to achieve a specified lifetime for the flash drive by controlling or restricting the write performance for the flash drive. However, as noted above and will also be appreciated by those skilled in the art, the techniques herein have much broader applicability for use with different types of devices having the same or different primary causes of wear out leading to device failure.

Existing techniques may attempt to predict when flash memory will wear out based on usage and thus attempt to determine the lifetime based on a current frequency of performing write operations. As explained in more detail elsewhere, techniques described herein may be used to change or modify the usage, such as the rate at which write operations are performed, by artificially reducing write performance for the device that incorporates the wearable memory so that the device will predictably last a specified lifetime. The techniques herein may be performed in an embodiment in addition to other techniques, such as ECC and wear leveling, for the particular type of device. Thus, for a flash drive, the techniques herein may be used to restrict the write performance (e.g., number of write operations performed in a given time period) for the flash drive. If user is trying to write to the device too frequently, steps may be performed to slow down or decrease the frequency at which write operations are performed, serviced, and the like. For example, one or more delays may be injected in connection with a write request so that the write request takes longer to complete resulting in less writes being made to the device over a period of time (e.g., resulting in decreased write performance, frequency or rate at which writes are performed). An embodiment may, for example, collect statistics on a number of writes to a device such as by counting the number of writes to the device in a span of time. The foregoing information may then be used to compute statistics regarding how frequently a customer is writing to a device. Code may then be executed to determine whether, based on the current rate at which write operations are performed, to inject extra time delays at one or more various processing points resulting in a longer amount of time to complete subsequent write operations. By injecting such time delays, the rate at which write operations are performed or the write performance for the device, decreases.

As known in the art, writing to a flash drive, for example, such as one using SLC technology, includes performing a first operation to erase any existing data and then a second operation to write the new data to be stored. Although description herein may be made to performing a write operation to the flash drive for purposes of simplification in description, it will be appreciated that performing write operations to flash drives as described herein implies performing both the necessary erasure operation and write operation for writing data to the flash drive. Additionally, in connection with the foregoing for examples described herein regarding flash drives, wear out or usage may be expressed as being dependent on a number of write operations performed although the wear out or usage is actually caused by (e.g., dependent upon) performing the implied erasure operation in order to effect the subsequent write operation to record or write new data to the flash drive. Thus, description herein for flash drives referring to wear out or usage based on a number of write operations implies the wear out or usage in accordance with the implied erasure operation necessary to effect the subsequent writing of the new data. In connection with obtaining a measurement regarding wear out or usage, the number of erasures or write operations may be used.

It should be noted that an embodiment may use techniques herein with a flash drive that performs writes to a group or portion of cells of the device, such as a block of cells. Thus, when writing to the flash drive, a number of writes may be performed at a time in accordance with a number of cells in each block. For example, a write operation to store new data to a flash drive may write to a block of cells in which each block stores 128 kB (kilobytes) of data so that a single erase and write sequence of operations may be performed to write 128 kB of data as a unit to the block.

In accordance with the techniques herein, a lifetime of a device may be specified. For example, it may be desirable to obtain a 10 year lifetime for a flash drive. For purposes of illustration only, assume a flash drive uses a memory technology whereby the flash drive has a guaranteed wear out of 3,200,000,000 (3.2 billion) writes so that it is expected that after 3.2 billion writes in total are performed to the device, writing to the device is not guaranteed to result in recordation of the data written. Also, for simplification, assume a wear leveling technique is utilized so that each cell of the device has had approximately a same number of writes performed at any given point in time. Also, for purposes of this example, suppose the flash device stores 4 GB of data forming 32 thousand blocks, each block storing 128 kB of data. Thus, each block may be expected to last for 100,000 writes (e.g., it is expected that 100,000 writes may be performed to each block prior to device failure. In order to attain the 10 year lifetime, the write performance rate for the device should not exceed 320 million writes/year, approximately 26,666,667 writes/month, approximately 876,712 writes/day, and so on, as may be determined for different time intervals. The foregoing write performance rate may also be referred to as the desired or target write performance rate in order to attain the desired specified lifetime of 10 years for the device. For purposes of simplification of illustration, assume a target write performance rate of 900,000 writes/day for the flash device is needed in order to achieve an expected 10 year lifetime. At the end of a first day, data may be collected as to how many writes were performed to the device in the first day. If the number of writes performed for the first day exceeded the allotted daily amount of 900,000 writes (or within some tolerance level thereof), the number of writes allowed to complete the second following day may be restricted so that the total number of writes for the 2 day time period (cumulatively for days 1 and 2) does not exceed 900,000*2=1.8 million writes. If the foregoing daily amount has not been exceeded on the first day, the write performance is not restricted in the second day. Similarly, at the end of the second day, a determination may be made of the cumulative number of writes performed over the two day period exceeds 1.8 million writes (e.g., #days*daily rate), or rather exceeds the target frequency or write performance rate of 900,000 writes/day. If the target rate is exceeded, then measures may be taken to decrease the write performance such as by injecting added delays in connection with processing each write on day 3. In connection with taking steps to decrease the actual current write performance, such as by injecting an added delay in connection with each write request, some of the new write requests made on day 3 may actually not be serviced and/or completed until day 4. Such techniques which decrease the write performance may be used in connection with processing write operations often occurring in bursts or busy periods (such as days in which the number of new write requests exceeds the daily write performance rate of 900,000) in combination with other slower periods (such as days in which the number of new write operation requests is less than the write performance rate of 900,000) so that over a relatively longer time period (such as over a week, month or year), the target write performance rate is maintained. If injecting such delays to restrict the daily write performance rate to 900,000 which should be maintained to achieve the specified lifetime of 10 years has undesirable effects, such as undesirable or unacceptable performance for an application using the device, then other system changes may be required. For example, it may be that additional storage devices are needed for use in connection with data storage for the application. The techniques herein may be use to adjust the write performance in an ongoing manner at different time periods so that less write operations may be completed or serviced in a given time interval but the length of time or lifetime that the device is expected to be predictably usable may be achieved.

As will be appreciated by those skilled in the art, the write performance rate, such as the target write performance rate described above, may be expressed in a variety of different ways. As mentioned above, the target rate may be expressed as a rate in terms of varying units of time, such as yearly, monthly, weekly, daily, and the like. Additionally, the target rate may be expressed with respect to the entire device or a portion thereof. For example, as described above, the target write performance rate for a flash drive may be expressed with respect to performing a target number of write operations within a given time period with respect to the entire drive (e.g., 9,000 writes/day made in total to the device), or performing a number of write operations within a given time period with respect to a portion of the device, such as a block. Similarly, other measurements described herein based on the rate may also be expressed with respect to other units, portions of the device (such as per block), and the like, although reference may be made herein in following examples to particular units of time, the entire device, and the like.

As mentioned above, decreasing the write performance rate, such as by injecting additional time delays in connection with processing write requests, is acceptable and can be performed because workloads may be temporal. In other words, the workload for a device may be busy for a time period and then not busy so that the techniques herein may be used to distribute the number of writes performed for a device over a time period. For example, there may be a large number of writes for the device on Monday-Tuesday but then the rate of write operations decreases for the remainder of the week. Therefore some of the write operations from the busy time period of Monday-Tuesday may not actually be done until Wednesday or later using the techniques herein resulting in distributing the writes performed to the device on a daily basis over a time period such as a week. As also described above, if using the techniques herein to control and adjust the write performance for the device results in an unacceptable level of write performance for the customer, then the customer can add more devices for use with an application so that the collective increase in the number of drives achieves the desired write performance and also achieves the desired device lifetime. In other words, the techniques herein may be used so that the customer does not wear out the devices resulting in a device failure prior to when expected. For example, the customer may plan to replace drives toward the end of their expected lifetime but, due to a higher write performance rate, the device may experience failure at an earlier point in time. Such unexpected data failures may unnecessarily cost the customer in terms of time and money.

As such, the techniques herein may be used in order to more predictably determine device failures and plan to accordingly replace drives with respect to a specified lifetime. The customer can add devices as needed to achieve a desired write performance level and also have a specified lifetime for these devices in order to avoid the foregoing early and unplanned device failures. The customer may rather incur costs for additional device(s) and have more data storage system reliability rather than experience unexpected data failures due to an excessive usage rate.

Formulaically, as will be described below, the techniques herein may be used in which a specified lifetime of a device may be fixed or held constant and the write performance rate may be varied to achieve the specified lifetime.

In connection with flash drives as described above, there are an expected or guaranteed number of writes to each cell until device failure occurs. Thus, the lifetime, L, of a flash drive, representing a specified expected age of the device in terms of time until a device failure occurs is based on the number of expected writes, W, that may be performed during L until device failure, and the rate, R, (e.g., write performance rate or frequency) indicating the number of writes performed in a given time period, and may be expressed as:

$$L = W * 1/R \qquad \text{EQUATION 1}$$

More generally, the lifetime, L, of a device may be based on one or more factors, such as number of writes, which affect the expected lifetime of the device or the time at which the device is expected to fail primarily due to wear out. The one or more factors affecting the lifetime may vary with the particular type of device technology. Thus, the foregoing EQUATION 1 representing a specified lifetime L of any type of device having a lifetime at which device failure is expected and is primarily determined in accordance with usage may be more generally written as a function F:

$$L = F(x1, \ldots, xn, R) \qquad \text{EQUATION 2}$$

where F is a function, and each xi is a factor in determining the wear or usage of the device affecting device failure, $n \geq 1$, and R represents the usage rate.

Each of the factors xi in EQUATION 2 may be characterized as a factor affecting the expected usage or cumulative amount of use expected to occur during the expected lifetime L of the device. As expressed above, the expected usage of a device affecting L may be determined generally in accordance with one or more factors. For flash drives, the expected usage to occur during the lifetime L of the device until failure may be expressed as the number of writes W described above in connection with EQUATION 1. Thus, the expected usage of a device during the lifetime L of the device prior to failure may be characterized as primarily dependent upon one or more factors, xi. With reference to EQUATION 1, each xi in EQUATION 2 is a factor affecting W of EQUATION 1 in connection with flash drives where W represents the expected usage or cumulative amount of usage (e.g., number of writes) expected to be performed to the flash device during the device's lifetime L prior to device failure.

At any point in time, a current age of a device measured in units of time may be expressed in terms of cumulative device usage or wear to the device up to the point in time. For example, the current age of a flash drive at a point in time may be expressed as a cumulative number of writes performed to the device up to the point in time using EQUATION 1 as described above where, instead of L representing an expected lifetime, L may represent the current age, T, of the device measure in units of time. Thus, for a flash drive, if T represents the current age of the device as an amount of calendar or wall clock time that has elapsed that a device has been in use, and N (corresponding to W of EQUATION 1) represents a cumulative number of writes to the device performed during the time period T, then N/T represents a current write performance rate (corresponding to R of EQUATION 1). Similarly, the current age of any device in terms of time and usage or wear to a point in time may be more generally expressed using EQUATION 2 above and EQUATION 3 below. Based on the above, a current consumption rate or current usage rate, Rcurrent (e.g., such as the current write performance rate for a flash drive), at a time T (e.g., current age of the device in terms of wall clock time since deployed for use), wherein N represents the cumulative number of writes performed during the time period T, may be expressed as:

$$R_{current} = N/T \quad \text{EQUATION 3}$$

It should be noted that the foregoing EQUATION 3 may also be applied to express Rcurrent more generally as a current rate of consumption, rate of usage or rate of wear in connection with other devices or drives so that N represents a metric of the cumulative usage or wear on the drive during the time period T. For flash drives, N may be expressed as a number of writes or erasures for the device. For other drives, N may be a metric measuring current cumulative usage with respect to one or more other factors.

As another specific example as related to data storage, the techniques herein may be used in connection with any wearable memory or memory which primarily fails due to wear out. The techniques herein may be applied for use in connection with disk drives. Disk drives have expected lifetime due to mechanical parts and the expected lifetime of a disk drive is related to a number of times that the disk is spun down and up. In connection with the techniques herein, a specified lifetime of a disk drive may be attained by controlling a frequency at which the drives are spun down and up. For example, in a MAID (massive array of idle disk) systems, each drive may be spun up on demand as needed to save power. However, rather than always spin a drive down and up based on demand to save power, a system using the techniques herein may control the number of times that the drive is spun down and/or up to achieve a specified lifetime. For example, an embodiment may count how many times a drive is spun up/down and may opt to leave a drive up spinning rather than spinning down the drive when not in use. Each time the drive is spun down and back up again for usage increases the amount of wear of the device and affects the lifetime of usage of the drive prior to an expected failure. The techniques herein may be used to adjust the frequency at which the drive is spun down and up.

The expected lifetime of a device, L, in terms of time, and the factors affecting the lifetime or expected usage during the lifetime L (e.g., the factors, xi, used in determining the cumulative expected usage of the device prior to failure as expressed in connection with EQUATION 2) may be determined in a variety of different ways. It should be noted that the foregoing factors xi may also be used in determining a current age of the device. An expected lifetime L and factors affecting the usage and thus the lifetime and current age of a device may be obtained from vendors, field data, simulations, and the like. The expected lifetime L of a device expressed in units of time may vary depending on the particular factors. Values used for L may be customized for a particular customer and operating environment. For example, in accordance with EQUATION 1, a flash drive may have an expected lifetime L based on a guaranteed number of writes W and a write performance rate R. The foregoing L may be expressed using EQUATION 1 as just described, for example, if the device operates in an environment where temperature and humidity are also maintained within specified thresholds. If one or more of the foregoing thresholds for temperature and humidity are not maintained, the number of writes W expected to occur prior to device failure may decrease to W2, and thus the expected lifetime L also decreases to L2 if R remains the same. In order to still achieve L or hold L constant with the revised W2 using the techniques herein, the target rate R needed to attain L may be reduced to a new rate R2. As an example with reference to EQUATION 1, if a device has an expected lifetime L=10 years until failure with W=10 million writes performed during L with R=1 million writes/year. Assume the device will be deployed in a customer system which will have excessive temperature and/or humidity that results in W2=5 million (e.g., it is expected that the device failure will occur after 5 million writes). At the current rate R, the device will actually only last 5 years. In order to achieve the desired or expected lifetime of 10 years, L=10, the rate may be adjusted to be the revised rate of R2=½ million writes/year. Thus, the rate R2 may be the revised target write performance rate. The actual measured write performance rate may be adjusted using the techniques herein to achieve the target rate R2 and attain the desired expected lifetime L.

It should be noted that the foregoing revised target rate R2 may be determined initially as well as in an ongoing or continuous manner as the operating environment may change over time. For example, the operating environment may meet temperature and humidity conditions when initially deployed so that initially the target rate R may be used. At a later point in time, the operating environment may change as may be determined by monitoring temperature and humidity and a revised target rate may then be used. Consider an example where the initial conditions of the operating environment apply as described above for L=10 year, W=10 million writes and R=1 million writes/year. After two years and after 2 million writes have been made to the device, the operating environment changes to conditions where the device is only expected to have a total of 5 million writes prior to device failure. Other techniques may be used to determine a revised target rate R2 for the current operating environment in order to achieve an expected lifetime of 10 years. For example, since 2 million writes have already been made to the device, ⅕ of the number of expected writes prior to device failure (e.g., 2/10 million writes) have been performed. Thus, it may be determined that ⅕ of the device's life has elapsed and the device has ⅘ remaining. For the revised current operating environment in which the expected number of writes prior to failure is 5 million (not 10 million), ⅘ of the device's life may correspond to 4 million remaining writes expected given the current revised operating environment. To achieve a desired lifetime L for the device of 10 years, the remaining 4 million writes may be performed over the remaining time in L of 8 years using a revised write performance rate R2 of 4 million writes/8 years=½ million writes/year. The foregoing is just one example of how a revised rate R2 may be determined.

Similar adjustments to the number of writes expected to occur prior to device failure may be made based on particulars of each device. Such particulars may include, for example, existence of a known defect which decreases the number of expected writes prior to failure. A defect may be determined based on production information provided by a manufacturer or vendor such as, for example, a certain production lot of drives is known to contain such a defect. Particulars for a drive may also be obtained through real time monitoring of a drive to gather data which is then used to detect the existence of defects or secondary characteristics that are typically associated with a certain of number writes having been performed to the flash drive. When such defects are known to reduce the number of expected writes prior to device failure, a new target performance rate R can be determined in order to attain the same lifetime L as with a prior higher target performance rate as just described.

Using the techniques described above in EQUATION 1 as applied to a flash drive, a specified lifetime L of a device may be determined. In order to achieve the L for the device, a target write performance rate R may be determined. In order to achieve L, data may be collected by monitoring the number of writes W1 made to the device over an elapsed period of time T1. The actual measured performance rate R1 at a point in time T1 may be determined as W1/T1. If R1 exceeds the target performance rate R, actions may be taken to reduce R1 such as by injecting additional delays when processing write requests. It should be noted that R1 as just described represents Rcurrent as expressed in connection with EQUATION 3. Thus, using the techniques herein, more generally a target performance rate R may be determined as expressed using EQUATION 1. Subsequently, at one or more later points in time, the actual performance rate may be determined as Rcurrent using EQUATION 3. Rcurrent may be compared to R target and, if Rcurrent exceeds the target R, adjustments can be made to effectively reduce a current rate of usage or consumption, Rcurrent.

Besides making adjustments to the lifetime of the device as described above, adjustments can be made with respect to a current age in terms of usage or wear out determined for a device at a point in time. In other words, certain characteristics or defects may not be associated with an overall reduction in the number of writes expected prior to device failure affecting a target performance rate maintained to achieve the desired lifetime L. Rather, the detection of certain characteristics or observance of certain facts or measured data may be associated with a particular amount of current device usage or wear to the device at a point in time when the characteristics are observed. Thus, in such cases, adjustments can be made to calculations performed with respect to a current age of a device measured in terms of cumulative device usage or wear to the device up to the point in time. With respect to a flash drive, its current usage or wear at time T1=cumulative number of writes during elapsed time T1, where T1 is a measure in units of time as to how long the device has been in use. Through monitoring the device and gathering data regarding its operation, it may be determined that the device is exhibiting characteristics typical of a device which has had a certain number of cumulative writes performed which may differ from the actual number of writes made to the device during the elapsed time T1. As an example with respect to flash drives, the device can be monitored for certain characteristics that indicate an age in terms of wear out or usage with respect to the number of writes expected prior to device failure. Operation on flash memory may operate on blocks of a size, such as 4K. Associated with each block is an additional portion of flash memory storage for storing other information relevant to that block. Such information may include, for example, an ECC for the block. Failure of one or more individual cells in a block may be detected when writing to the block. The ECC may be used to perform a correction upon failure of any data writes. An ECC can be used to perform a correction for a number of bits in error, such as up to 16 bits. The number of bits/block that experienced failure upon a write cycle may typically increase with the cumulative number of writes made to the block to a point in time. As the total number of writes made to the block increases, the number of bits that fail also increases. Rather than count a number of write operations performed to the device as a measure of wear out or current cumulative usage to a device at a point in time, an embodiment may monitor the number of bits that have failed in each block. The number of observed bit failures for one or more of the blocks may be used in connection with determining the cumulative number of writes that have occurred or been performed to the device. A curve, table or other form of data may express a predicted number of writes that have been performed based on an observed number of bit failures for the device. Referring back to EQUATION 3, the foregoing describes how to indirectly determine a value for N at a point in time as may be used to determine a current usage or consumption rate Rcurrent. In connection with flash drives, Rcurrent represents the current write performance rate or current rate at which writes are performed and N represents a number of cumulative writes performed during a time period.

Referring to FIG. 3, shown is an example of a data set 150 in tabular form that may represent a predicted number of cumulative writes in column 154 for a number bit failures in the device 152. Values in columns 152 and 154 may be in increasing order. An embodiment may determine a value for the number of bit failures in the device and then use this value to index into column 152 of table 150 to determine a corresponding value in 154. It should be noted that a value for 152 may be determined in a variety of ways using observed bit failures for the flash drive. For example, an embodiment may keep a running total of all bit failures across all blocks and look for a value in column 152 that matches the running total. If there is no match in column 152 for an observed running total of bit failures for the device, but rather the observed running total falls between two such values in column 152, then techniques such as interpolation may be used to determine a corresponding value of 154 representing the predicted number of writes that have occurred to the device. Values in column 154 may be used as values for N in connection with determining Rcurrent with EQUATION 3. As a variation to the foregoing, the current wear or usage expressed as an actual number of writes performed to the device over a period of time may also be maintained. At various points in time, an embodiment may use the foregoing technique with the table 150 to adjust the current wear or usage of the device occurring to a point in time. It should be noted that using predicted values, such as illustrated in FIG. 3, indicating the current wear or usage may result in either an increase or decrease with respect to the actual number of writes that may have been performed. With reference back to EQUATION 3, an embodiment may thus obtain an observed value for N and may adjust N at various points in time depending on other predicted values, such as included in column 154.

The foregoing is one example in connection with flash drives illustrating adjustment of current usage or wear out (e.g., N of EQUATION 3) in accordance with one or more observed characteristics. Adjustments can be made in a similar manner as appropriate for different drive technologies and ways in which current wear or usage at a point in time may be determined.

The lifetime L of a device may be used to express an availability A of a device, and thus the availability A of a system including that device. For purposes of illustration and simplicity, an initial description will be set forth in which a data storage system may only include a single device and the system's availability A may be dependent on only the single device. A customer may have a service level agreement (SLA) specifying a level of system availability to be maintained. As described below, the availability calculation for a system may be expressed in terms of lifetime of a device as described above. Thus, for example with reference to flash drives, in order to achieve a desired level of system availability where the system includes a single flash drive, a specified device lifetime L and target write performance rate R may be maintained. The actual write performance rate of the device may be measured and techniques described herein to adjust the actual write performance rate of the device so as not to exceed the target write performance rate R. Maintaining an actual write performance rate for the device which does not exceed the target rate R1 achieves a desired lifetime L for the device and also a desired availability for the device and system. As will be apparent based on following descriptions, having an actual write performance rate that exceeds the target rate R causes the actual lifetime of the device to decrease, and thereby also causes the device availability and system availability calculations to decrease.

Availability A of a system may expressed as a percentage value representing an amount of time that a system is up and in a functioning condition and has not experienced a system failure. A system which has experiences a failure is down and unavailable. Availability A expressed as a percentage may be represented as $$A = Uptime/(Uptime+Downtime) \quad \text{EQUATION 4}$$

where uptime represents an amount of time the system is up (not experiencing a system failure so that the system is available), and downtime represents an amount of time the system is down (experiencing a system failure so that the system is unavailable).

It should be noted that a fault in the system may or may not lead to unavailability of the system. A fault may occur and may accordingly be corrected while the system is still available. For example, in a system having RAID-6, one of the data or parity drives may physically fail causing a fault. However, the data storage system is still available while processing is performed to recover the data of the faulted drive, store the recovered data on a spare drive, and then resume normal processing. During the time that the foregoing elapses, the system is still available and there has not been a system failure. In the foregoing, the single drive fault can be cured so that a fault does not result in a system failure because all data requests can be satisfied within a predetermined amount of time. In connection with RAID-6, two drives of the RAID configuration may fail at a same time and the system may still be available. Unavailability of a system as described herein may mean that the data storage system is not able to supply the customer with requested data within a predetermined amount of time. Rather, a system that is available is one that capable of supplying any requested data of the system within a predetermined amount of time. It should be noted that the definition of availability of a system may vary with customer expectation and other factors that may affect the availability of a system besides availability of the drives containing system data. To further illustrate, the availability of a system may be affected by other factors, for example, such as a power failure, network failures, and the like. Absent these additional factors, the availability of a system may be expressed as dependent on only the drives of the system. Otherwise, the availability of a system may be dependent on the availability of the drives as well as other factors, such as availability of the network or other connection providing connectivity, availability of power, and the like. It should be noted that reference made herein equating availability of a system to that of the devices in the system may be characterized as making a simplifying assumption for purposes of illustration of the techniques herein where the A of the system is dependent only on the A of the device(s) therein.

In other terms, for a repairable system, $$A = MTTF/(MTTF+MTTR) \quad \text{EQUATION 5}$$

where MTTF is the mean time to fail, and MTTR is the mean time to repair the failures that occur. "Time To Repair" may include all the time that is needed from the point the system (or subsystem) ceases to be available to do work until it is once again available for doing useful work. "Mean" may be the arithmetic mean or the average. MTBF may be used in place of MTTF in the above EQUATION 5. MTBF is mean time between failures and may be expressed as:

$$MTBF = MTTF + MTTR \quad \text{EQUATION 6}$$

Since MTTR in practice is relatively much smaller than MTTF, MTTF approximates MTBF. Thus, for practical purposes, MTTF and MTBF may be within a specified tolerance so that they both represent a same value and may be used in formulae interchangeably. If failures are expressed as a failure rate ($\lambda$), then the failure rate may also be expressed in terms of MTTF as:

$$MTTF = \frac{1}{\lambda} \quad \text{EQUATION 7}$$

The lifetime L of a device as described above, for example, with reference to EQUATIONS 1 and 2, may be used as the MTTF for the device when determining the availability of the device, and the availability for the system including the device. When computing the availability A of a system, the A for the system is based on the availability of the one or more devices in the system, and possibly the availability of one or more other entities affecting system availability, such as power, network connectivity, and the like, as may vary with embodiment. Thus, for purposes of illustration of a system which includes a single device, the A of the device may represent the A for the system if the availability of the system depends only on the availability of the device. Otherwise, if the availability of the system depends on things in addition to the device(s) of the system, then the availability of the system can be no greater than the availability for the device. As described above, if an embodiment assumes that the availability of a system depends solely on the availability of device (s) therein, then the availability of the system may be equated to that of the device(s) in the system.

The lifetime L as described herein may be used as the MTTF for the device because L as described herein is determined for a device having a predominant failure mode based on wear out or usage.

Following is an illustration of how values used in determining the MTTF, MTTR and MTBF may be measured.

Figure 4:
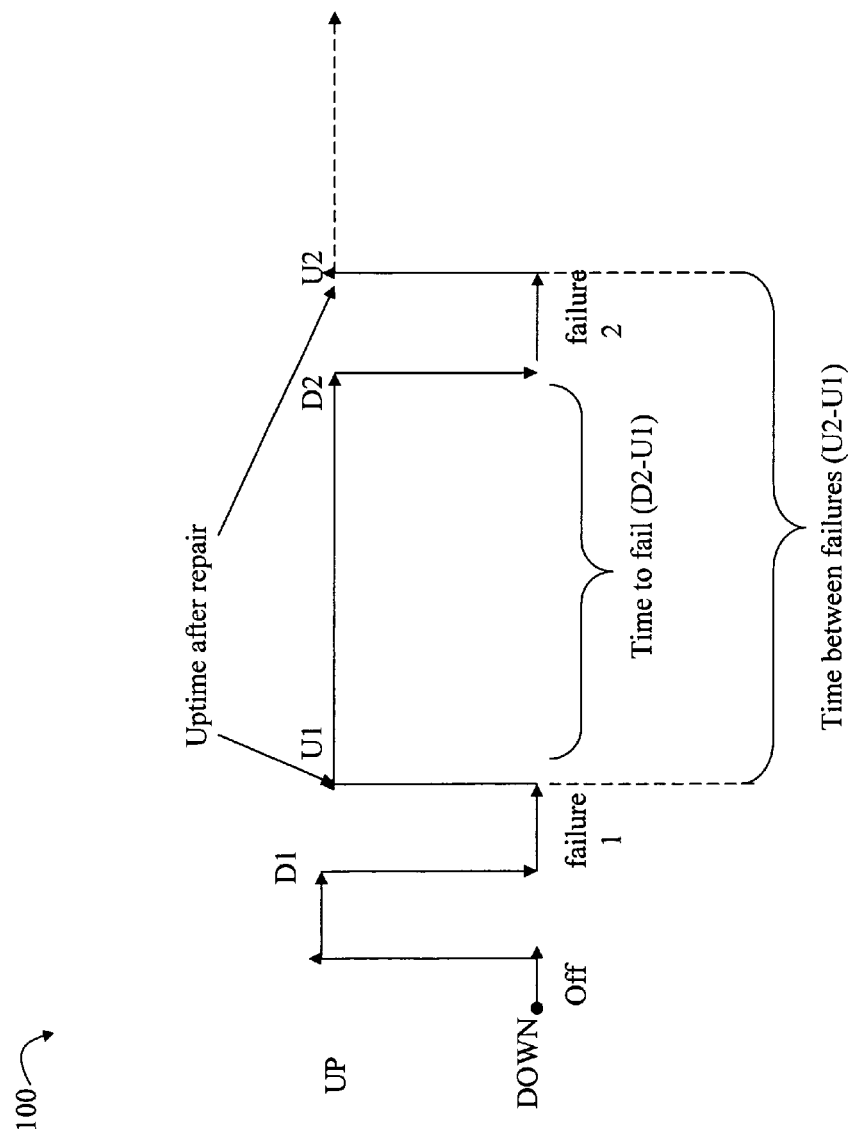
FIG. 4 is an example illustrating different values that may be used in connection with determining an availability calculation for a system.

Referring to FIG. 4, shown is an example illustrating events that may occur during the life of a system. The example 100 represents events that may occur for a system at different points in time from when the system is turned on. Points D1 and D2 represent points in time at which system failures occur causing a system to be unavailable. U1 and U2 represent points in time at which the system is repaired and brought back to a state of availability. With reference to the example 100, D2-U1 may represent the time between failure 2 and failure 1, or time to fail (TTF). A first time to repair (TTR) may be represented by U1-D1 and a second TTR may be represented as U2-D2. The time between failure 2 and failure 1 (TBF) may be represented by U2-U1. The MTTF may be determined as a mean or average using TTFs as illustrated. Similarly, MTTR and MTBF may be determined, respectively, using TTR and TBF values as illustrated.

Based on the foregoing where MTTF may be expressed as the lifetime L described herein, extending or increasing values for a device lifetime L may be achieved by reducing the rate of usage, such as the write performance rate for flash drives, thereby increasing the MTBF, and thus MTTF which is really decreasing the failure rate=1/MTTF (EQUATION 7).

In order to obtain a high rate of availability as may specified in the SLA, a data storage system may include redundancy in drives and/or systems, such as with different RAID levels as mentioned elsewhere herein. In connection with a system having multiple storage devices, the availability calculation for the system may be based on the availability of the multiple drives and the particular configuration.

A system may have available for use dynamic spare devices, include data redundancy such as with mirrored data, be able to rebuild or recover data (such as with RAID-5), and the like. Device, and hence system, repairs may utilize the spare device and the repair time may include, for example, the time it takes to recover or rebuild the lost data, such as with RAID-5, or the time it copy data from the mirror device to the dynamic spare. Depending on the system configuration, such as RAID level used, a single device failure or even a double device failure in the RAID group may cause a system fault and the system may still be available. During the repair time to correct the single device failure, one or more other faults may occur then causing the system to become unavailable depending on the particular system, such as the specified RAID-level and whether protection is provided for a double drive failure.

The basic calculations for A of a single system having a single device as just described may be mathematically extended for use with more complex systems. For example, if a system is constructed out of multiple subsystems, the availability of each of the subsystems can be used to calculate the availability of the total system. For instance, if a system is composed of two subsystems, a and b, and if the total system fails any time either of the subsystems fails, the resulting availability may be represented as:

$$A = (A_a)(A_b) \quad \text{EQUATION 8}$$

where A is the availability of the entire system, $A_a$ is the availability of subsystem a, and $A_b$ is the availability of subsystem b. In this case, the two subsystems may be characterized as being in series with one another and the system availability A may be expressed as a product of the availabilities of each subsystem as in EQUATION 8.

As another example in connection with a fault tolerant system arrangement, two substantially identical subsystems may be fashioned so that the failure of either of the subsystems is masked by the other non-failing subsystem. The two subsystems may now be characterized as in parallel with respect to one another where either subsystem is capable of performing the total work requirements of the system, so that only one of the two subsystems is needed to carry on the work and provide the system availability. Mathematically, this scenario may be represented as:

$$A = 1 - (1-A_a)(1-A_b) \quad \text{EQUATION 9}$$

where 1-Ai represents the percentage of time the system i is unavailable.

If it is assumed $A_a=A_b$ due to the fact that the two subsystems are identical, so their availabilities are identical, then that availability $A_a$ can be used for both subsystems in the formula:

$$A = 1-(1-A_a)^2 \quad \text{EQUATION 10}$$

Based on EQUATION 10, one can calculate the effect of using RAID-1 to increase the availability of a disk subsystem. If the availability of a disk drive is $A_a$, then a pair of disk drives running in parallel (e.g., as mirrors) has an availability that approximates the result of EQUATION 10.

As another example, for a RAID-5 subsystem, the availability calculation is slightly more complex. In this case, the failure of a single subsystem (a drive) also does not cause the system to fail. However, not all of the subsystems are in parallel. For RAID-5, the MTBF for the RAID subsystem, and thus for practical purposes the MTTF of the RAID subsystem as a group, may be represented as:

$$MTBF_t = \frac{MTBF_{disk}^2}{D(D-1)MTTR} \quad \text{EQUATION 11}$$

where $MTBF_t$ is the Mean Time Between Failures for the RAID-5 group, $MTBF_{disk}$ is the Mean Time Between Failure for a single disk or other storage device, and D is the total number of devices or drives in the RAID-5 set. Using the lifetime L as described herein, the L for a disk, flash drive, or other type of drive, may be used as the $MTBF_{disk}$. For a RAID-5 system, a value for MTBF may be obtained using EQUATION 11 which approximates the MTTF for the system. Thus, the result of EQUATION 11 may be used as the MTTF value in EQUATION 5 to calculate the availability for the RAID-5 system.

As an extension of EQUATION 11 for applicability with RAID-6 storage configurations where two devices can fail without data loss (e.g, the system is available with up to 2 RAID-group drive failures), the MTBF for the RAID-6 subsystem, and thus for practical purposes the MTTF of the RAID-6 subsystem as a group, may be represented as:

$$MTBF_t = \frac{MTBF_{disk}^3}{D(D-1)(D-2)MTTR^2} \quad \text{EQUATION 12}$$

As can be seen, tolerance to an increasing number of faults follows a pattern in the formula. Using the lifetime L as described herein, the L for a disk, flash drive, or other type of drive, may be used as the $MTBF_{disk}$. For a RAID-6 system, a value for MTBF may be obtained using EQUATION 12 which approximates the MTTF for the system. Thus, the result of EQUATION 12 may be used as the MTTF value in EQUATION 5 to calculate the availability for the RAID-6 system.

It will be appreciated by those skilled in the art that the foregoing are just some ways illustrating how availability and MTBF (and thus MTTF for practical purposes) may be calculated for the particular subsystem or system illustrated. It should be noted that the foregoing equations may be used in combination, alone or in conjunction with other equations, to determine the availability of a system. For example, if a system includes a RAID-5 subsystem and a RAID-6 subsystem, EQUATIONS 11 and 5 may be used to determine the availability for the RAID-5 subsystem, and EQUATIONS 12 and 5 may be used to determine the availability of the RAID-6 subsystem. Subsequently, the availabilities for the RAID-5 and RAID-6 subsystems may then be used with EQUATION 8 to determine the availability of the foregoing system.

As described above, the lifetime L of a device may be used in determining an availability of a data storage system. Thus, the techniques used herein to restrict a performance rate, such as a write performance rate or rate of processing write operations, may be used to achieve a specified lifetime L for one or more devices and also achieve a desired level of availability, such as may be specified in an SLA.

What will now be described are flowcharts of processing steps that may be performed in an embodiment in connection with the techniques herein. The following flowcharts summarize processing described above. It should be noted that although the steps of the following figures may make reference to processing performed with respect to a flash drive, it will be appreciated by those skilled in the art and as described elsewhere herein that similar processing steps may be performed in connection with other types of devices having a lifetime determined in accordance with one or more factors affecting wear out or usage expected prior to device failure.

Figure 5:
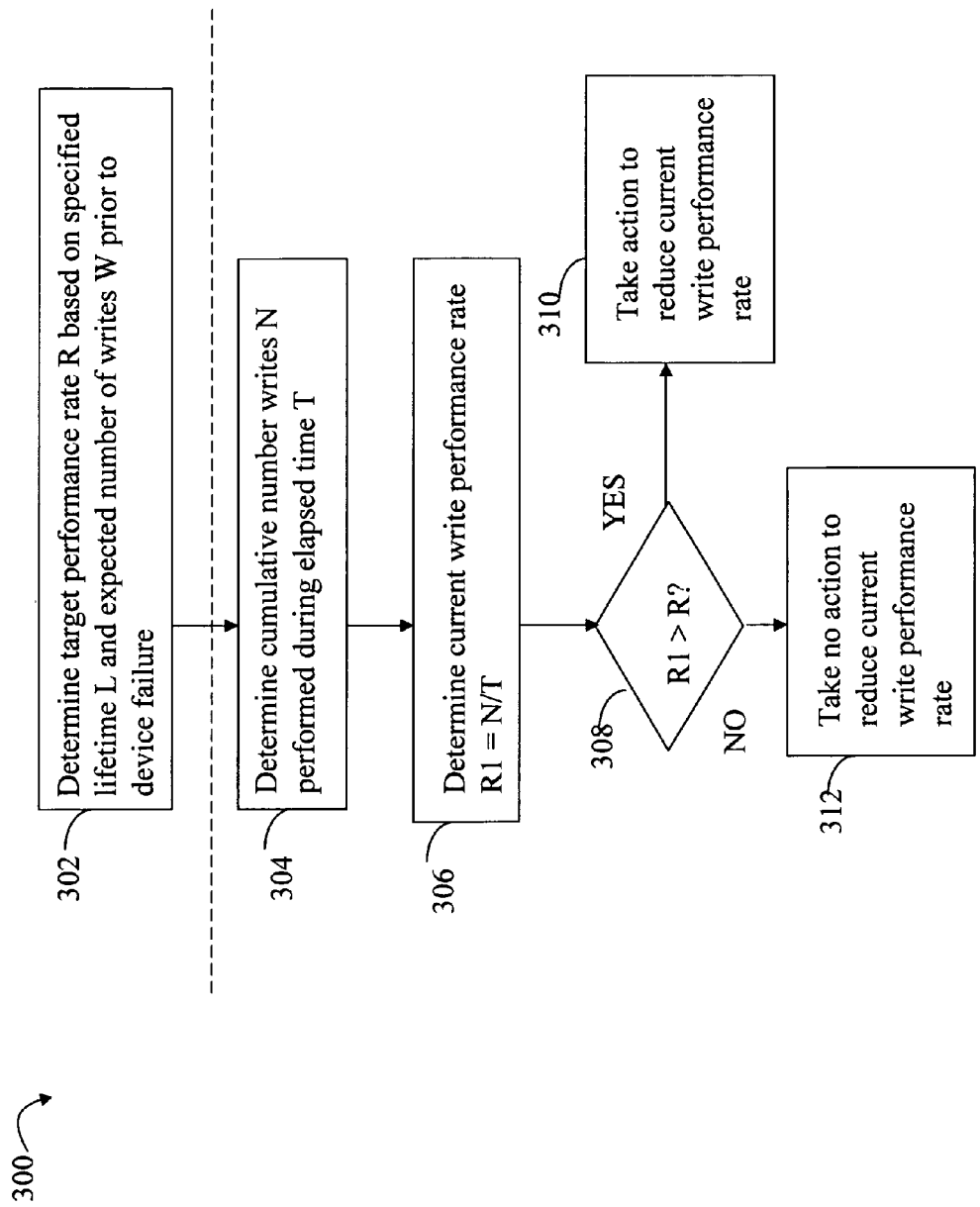
FIGS. 5-7 are flowcharts summarizing processing steps that may be performed in an embodiment in accordance with the techniques herein.

Referring to FIG. 5, shown is a flowchart of processing steps that may be performed in an embodiment. The steps of 300 summarize processing to initially determine a target performance rate R to achieve a desired lifetime L based on an expected amount of usage or wear out of the device prior to device failure occurring. At step 302, a target performance rate R may be determined based on a specified lifetime L and expected number of write W prior to flash drive failure. Step 302 may be performed at a first point in time, for example, based on EQUATIONS 1 and 2. At some point later, an evaluation of the current system performance may be performed. Thus, steps below the dashed line in FIG. 5 may be performed at each such point in time at which an evaluation is desired. The evaluation determines whether there is a need to restrict current system performance, such as reduce the write performance rate, in order to achieve the lifetime L. At step 304, a cumulative number of writes N performed to the flash drive during the elapsed time T may be determined. At step 306, a current write performance rate or rate at which write operations are processed may be determined. In step 306, the current write performance rate may be expressed as R1=N/T. R1 may be determined for any time period T. It should be noted that R1 determined in step 306 may be more generally described as an exemplary instance of EQUATION 3. At step 308, a determination is made as to whether R1 is greater than R, the target write performance rate. If step 308 evaluates to yes, control proceeds to step 310 to take action to reduce the current write performance rate as indicated by R1. If step 308 evaluates to no, control proceeds to step 312 where no action is take to reduce the current write performance rate as indicated by R1.

By performing the steps of flowchart 300, an embodiment may restrict the actual or measured write performance rate of a device, and thus of a system, to achieve a specified lifetime L. By doing the foregoing, a specified level of system availability can be achieved.

Figure 6:
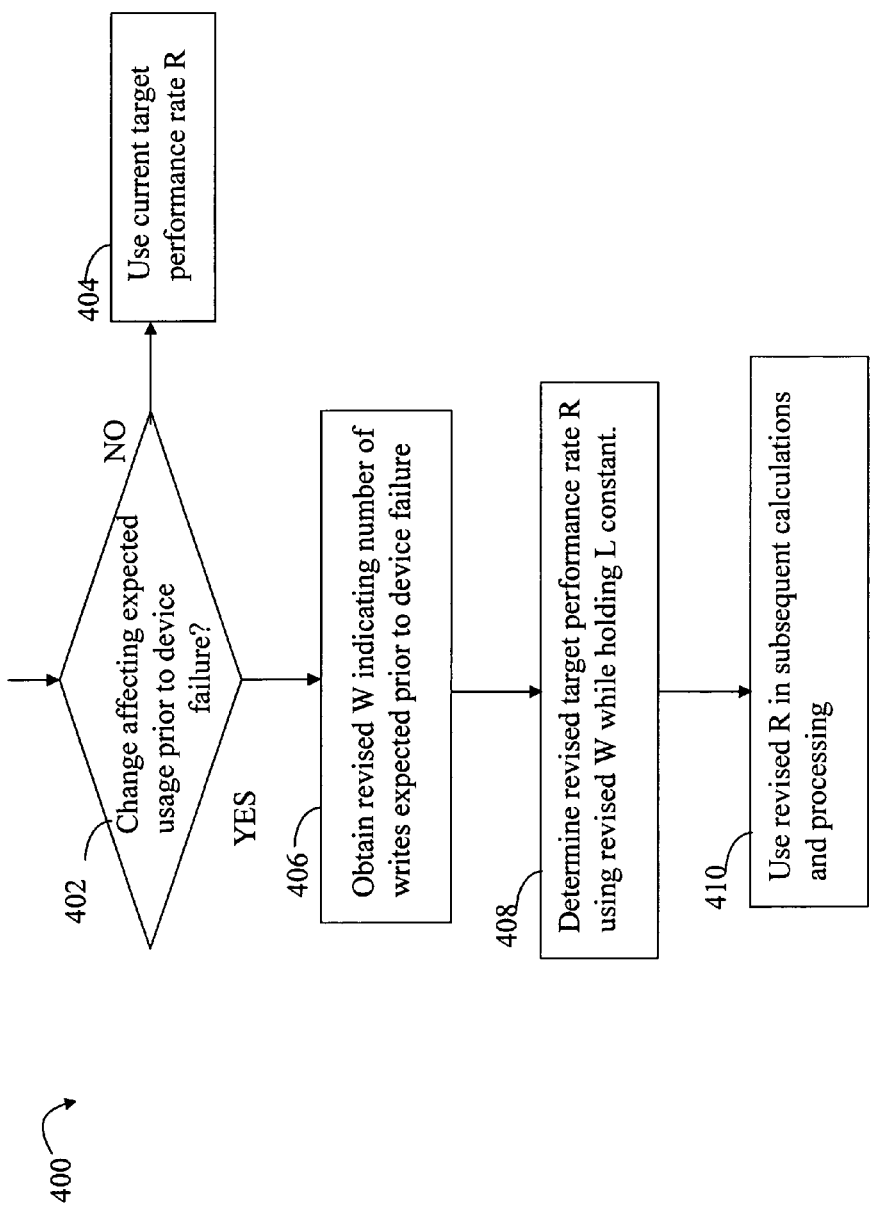

Referring to FIG. 6, shown is a flowchart of processing steps that may be performed in an embodiment using the techniques herein to obtain a revised target write performance rate. The steps of FIG. 6 may be performed in connection with a revised W or expected number of writes to be performed prior to device failure. As described above, the steps of flowchart 400 may be performed in connection with step 302 processing to achieve a revised R (e.g., revised target performance rate or more generally target usage rate R as in EQUATION 1), such as to adjust for known device defects in the particular devices of a customer's system, prior to performing any evaluation of the current system performance as in connection with steps following step 302. The steps of FIG. 6 may be performed, for example, to adjust and customize generic vendor-supplied values for the particular devices and known defects included in a system. The steps of flowchart 400 may also be performed at a later point in time after initial set up, for example, if the operating environment of the data storage system changes such as with a change in temperature, humidity, and the like, affecting the expected number of writes occurring prior to device failure.

At step 402, a determination is made as to whether there has been a change, such as in connection with the physical operating environment, that affects the expected usage or wear prior to device failure. If not, control proceeds to step 404 to use the current target write performance rate R. Otherwise, if step 402 evaluates to yes, control proceeds to step 406 to obtain a revised W indicating a number of writes expected prior to device failure. At step 408, a revised target performance rate R is determined using the revised W from step 406 while holding the lifetime L constant to ensure a particular system availability. At step 410, the revised R may be used in subsequent calculations and processing. For example, the revised R may be used in performing subsequent evaluations of the current system in steps 304, 306, 308, 310 and 312 of FIG. 5.

Figure 7:
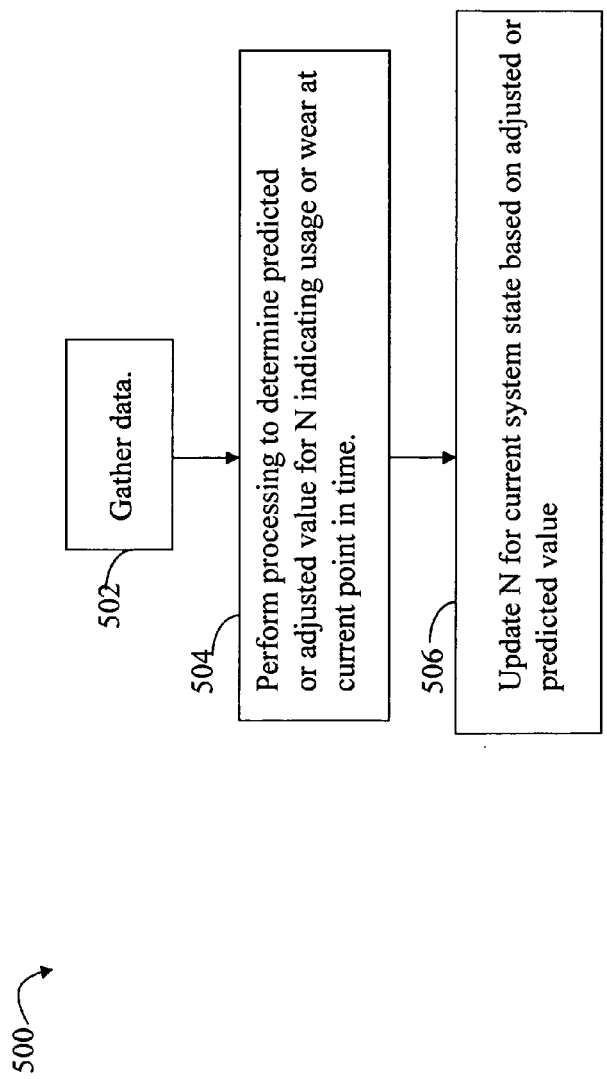

Referring to FIG. 7, shown is a flowchart of processing steps that may be performed in an embodiment in connection with adjusting N indicating the current usage or wear of a device at a point in time. The steps of FIG. 7 may be performed, for example, using the table 150 of FIG. 3 indicating a predicted number of cumulative writes. At step 502, data may be gathered. Such data in step 502 may be measured or observed values with respect to one or more factors of the device indicating wear or usage of the device at a point in time. For example, step 502 may include gathering data as to the number of bit failures in connection with writing to the flash device. At step 504, processing may be performed to determine a predicted or adjusted value for N indicating the current usage or wear at the current point in time. Step 504 may include, for example, using the table 150 to determine a predicted value for N based on the number of observed bit failures for the device obtained from step 502. In step 506, N for the current system state may be updated to be the adjusted or predicted value of N as determined in step 504. This new value for N in step 506 may be used going forward in subsequent processing, such as in connection with performing steps 304, 306, 308, 310, and 312 of FIG. 5.

As summarized above, an MTTF expressed as a lifetime L may be fixed or held constant. A target rate of usage or wear, such as the target write performance rate R, may be determined based on a wear out or usage, such as number of write operations W, expected prior to device failure. Current system performance may be periodically evaluated to determine whether a current rate of usage or wear is above the target rate needed to achieve L, and thus achieve a particular system availability. If the current rate of usage is too high, action may be taken to reduce or restrict the current rate of usage. For example, as described above in connection with write performance rate, time delays may be injected in connection with subsequent write operations in order to decrease the actual or measured write performance rate at a point in time as described herein in connection with EQUATION 3.

What will now be described and illustrated is how write delays may be injected in an embodiment using the techniques herein in connection with flash drives when the write performance rate of a system exceeds the target write performance rate. For purposes of simplicity in illustration, the system described below in connection with FIG. 8 includes a single flash device so that the availability of the system may be expressed as no greater than the availability of the single device.

Figure 8:
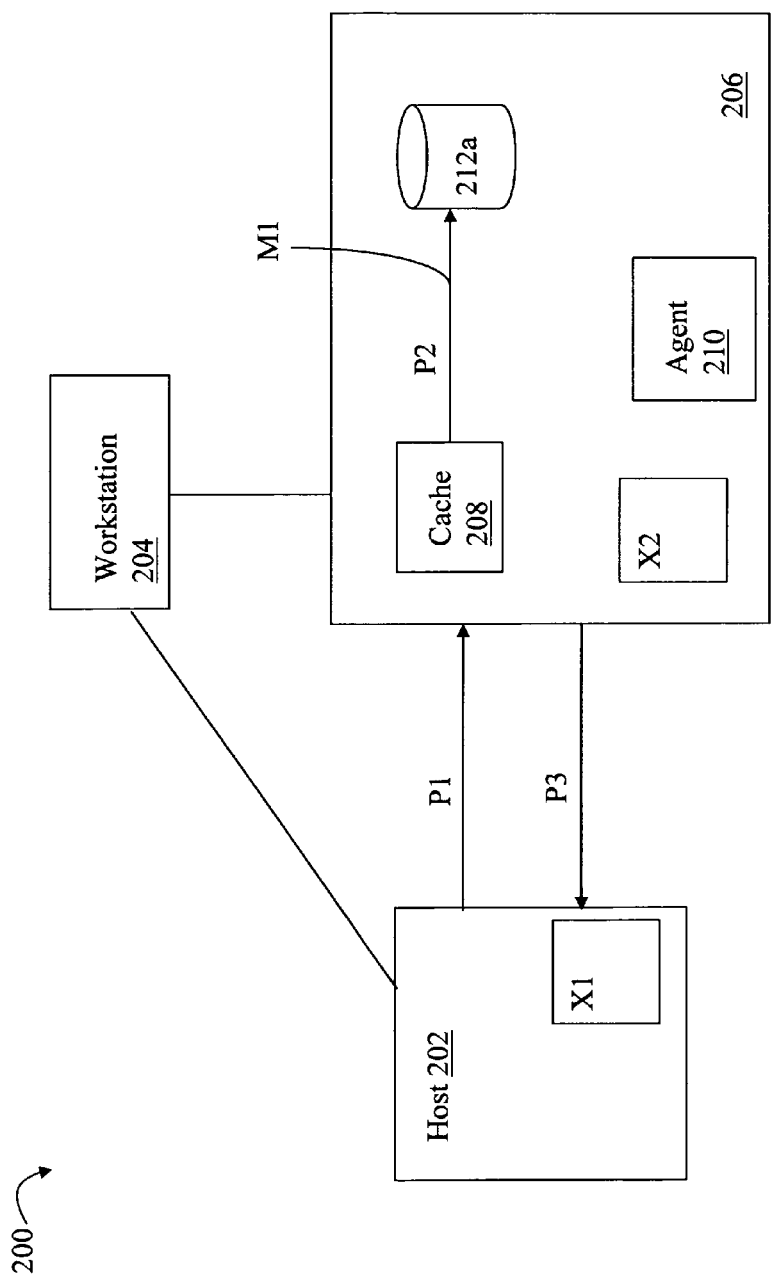
FIG. 8 is an example illustrating a system in which delays may be injected to control a write performance rate for a device.

Referring to FIG. 8, shown is an example illustrating components of a system in which the techniques described herein may be used. The example 200 includes a host 202, workstation 204, and data storage array 206. The host 202 may include code module X1. The array 206 may include a cache 208, code module X2, agent 210, and storage device 212a. For purposes of illustration, device 212a may be a flash drive and techniques herein may be used to control or restrict the rate at which write operations to 212a are performed. The cache 208 may be a data storage system cache as described above. As known in the art, the cache may be used, for example, holding write data that is subsequently destaged to device 212a. The agent 210 may collect information about the data storage array, such as the number of write operations performed during a time period, and may report this information to the workstation 204. Element 204 may also include code for gathering data from the agent 210 and then performing processing to determine whether an action needs to be taken to reduce the current write performance rate such as by injecting delays in connection with write operations. The agent 210 may collect data at point M1 as writes are destaged to 212a to determine a number of writes made in a time period. Elements P1, P2 and P3 illustrate different steps performed serially in connection with a write request issued by the host 202. The write request is sent P1 by the host to the array 206 and is stored in the cache 208. At a later point, the write data is destaged P2 to the device 212a and a response or acknowledgement may be sent P3 to the host. It should be noted that in an embodiment, a write request may actually consist of a first set of steps to obtain a write request from the host and then a second set of steps to obtain from the host the actual data of the write request to be written to the device. The series of P1-P3 may correspond, for example, to the second set of steps as just described.

Code on the workstation 204 may perform processing to determine whether to inject one or more time delays in connection with processing a write request. The workstation 204 may communicate with module X1 on the host and/or module X2 on the array to perform processing causing the delays in connection with subsequent write operations. Delays may be injected by X1 on the host delaying sending write requests to the array. For example, a threshold number of outstanding host write requests may be specified so that no additional write requests are sent to the array when the threshold is exceeded. The threshold may be dynamically modified by the workstation as communicated to module X1. For example, the threshold may be decreased to restrict write performance. The module X1 may also inject an actual time delay in connection with a write request, for example, received from an application executing on the host. Prior to sending the request from the host to the data storage array, the module X1 may inject a delay causing the request to be held on the host for a period of time prior to sending the request to the array as illustrated by P1. Code module X2 on the data storage system can limit or restrict the number of writes by limiting the resources of the array allocated for use in connection with servicing requests for the device 212a. For example, the number of cache slots used for servicing requests, or servicing specifically write requests, for the device may be reduced to reduce the actual or current write performance rate. An amount of cache allocated for use may be determined as described, for example, in U.S. Pat. No. 7,047,366, QOS Feature Knobs, May 16, 2006, to Ezra, and U.S. patent application Ser. No. 11/254,089, filed Oct. 19, 2005, DYNAMIC CACHE PARTITIONING, Yochai et al, both of which are incorporated by reference herein. The workstation 204 may communicate with module X2 to reduce the amount of cache resources used in connection with write requests for device 212a using a QOS mechanism as described in the foregoing '366 patent and/or '089 application which controls number of cache slots allocated for use in connection with a particular logical or physical device. The foregoing can be done, for example, using a control parameter having a value determined by software on the workstation and/or array to evaluate and throttle down the write performance. The value may indicate the number of cache slots allocated for use with the device. Module X2 may also inject a delay in connection with destaging data from the cache to device 212a as illustrated by P2. Module X2 may also inject a time delay by delaying sending an acknowledgement or response to the host as illustrated by P3.

One or more of the foregoing actions may be taken to directly or indirectly reduce the write performance rate or rate at which write operations are performed for a device. It should be noted that an embodiment may also monitor the data storage array and host activity to provide feedback to the customer. For example, an embodiment may monitor the number of times, duration or amount of times actions are taken to restrict write performance. Such information may be used as an indicator, along with possibly other observed behavior such as extended application response times for write operations, that one or more devices need to be added to achieve the desired availability as well as a desired level of performance, such as the write performance rate.

In connection with determining a time delay to inject, such as an amount of time to delay a request at the host, prior to destaging, or prior to sending a response to the host, an embodiment may use a variety of one or more techniques. For example, the current write performance rate of the device 212a may be determined at different time intervals (e.g., yearly, monthly, weekly) and may introduce a delay factor based on the particular time interval used to evaluate the current write performance. The amount of delay time injected may vary in accordance with the time interval (e.g., the larger time interval, the larger the delay), may be selected based on size of previous delays, how recent and/or the number of previous delays introduced, and the like.

In connection with flash drives, an embodiment may use wear leveling in an attempt to evenly distribute writes across all physical locations of the device. As such, each physical location of the flash drive may be expected to have approximately a same number of writes prior to device failure. However, an embodiment may also not use wear leveling and different techniques may be used to determine a current wear or usage of the device at a point in time. For example, an embodiment may determine MAX, a maximum number of writes made to any single block. Based on this for the single block, the number of writes for the device may be expressed as: # blocks of device*MAX. The foregoing value may be used in an embodiment in determining a current wear or usage for the flash drive at a point in time.

Described herein are particular examples in which the current usage or wear of a device at a point in time, the expected usage of the device prior to failure, and the like, are with respect to a portion of the device, such as with respect to each cell of a flash drive. It will be appreciated by those skilled in the art that values indicating the current usage or wear of a device, an expected usage of the device, and the like, may be expressed in a variety of different ways such as, with respect to other portion sizes of a device, the entire device, and the like. Furthermore, observed or collected data may also be expressed with respect to the entire device or a portion of the device.

An embodiment may implement the techniques herein using code executed by a processor. For example, an embodiment may implement the techniques herein using code which is executed by a processor of the workstation, host, data storage system, and/or inside a drive itself. For example, as described herein in connection with flash drives, a wear leveling may be performed by components of the flash drive itself Similarly, techniques described herein may be implemented using code included on the flash drive itself in a manner similar to that in which the flash drive may implement wear leveling techniques in an embodiment. As will be appreciated by those skilled in the art, the code may be stored on the data storage system or other component of the system on any one of a computer-readable medium having any one of a variety of different forms including volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, (DVD) or other optical storage, magnetic cassettes, magnetic tape, magnetic disk storage or other magnetic storage devices, or any other medium which can be used to store the desired information and which can accessed by a data storage system processor.

It should be noted that as described herein with respect to flash drives, wear out or usage affecting the device lifetime and expected point of device failure is based on the number of erasures. Thus, since each erasure is typically followed by a write and the desire to write new data being the reason for performing the erasure, the lifetime of a flash drive may be expressed as a number of expected writes or associated erasure operations performed. Thus, with reference to all the equations herein, such as EQUATION 1, for example, the lifetime L of the flash drive may have a target usage rate R measured in erasures as well as associated writes. Furthermore, in accordance with EQUATION 3, when taking actions to adjust the current performance rate Rcurrent determined at a point for flash drives, an embodiment may decrease or otherwise vary the rate of erasures rather than the subsequent writes. Adjusting the rate of erasures indirectly varies the rate at which subsequent writes are performed since writing data to a flash drive location cannot be performed until the associated preceding erasure operation erases data from the same flash drive location. An embodiment may also vary the rate of erasures alone, or in conjunction with, varying the rate of writes. In connection with the examples herein referencing flash drives, the target performance rate R (e.g., as in connection with EQUATIONS 1 and 2) may be determined with respect to a number of erasures or writes. The current performance rate Rcurrent (e.g., as in connection with EQUATION 3) may also be measured in terms of erasures or write and actions taken in connection with adjusting a current performance rate may include varying a number of erasures and/or varying a number of writes.

In connection with flash drives as described herein, writes may performed with respect to a portion of the device, such as a block, rather than individual cells. Thus, erasures and writes may be performed with respect to entire blocks of data at a time (e.g., as a single operation) rather than with respect to individual cells. In connection with the techniques herein, the target write performance rate R as in connection with EQUATIONS 1 and 2 and the current write performance rate Rcurrent as in connection with EQUATION 3 may be expressed with respect to each block. For example, the target rate R may be expressed as a number of erasure-write operations (referred to herein also as write operations with implied erasure) per block. Thus, at a point in time, with respect to EQUATION 3, the current cumulative usage or wear may be expressed as a sum of writes performed to each block. Similarly, the lifetime L of EQUATION 1 may be expressed as a sum of writes expected to be performed to each block of the device prior to the device failure. That is, EQUATION 1 may be used to express the lifetime L for each block and the lifetime of the device may be expressed as a first mathematical sum of each occurrence of EQUATION 1 for each block of the device. Similarly, EQUATION 3 may be used to express the current cumulative usage or wear N for each block and the current usage or wear for the device may be expressed as a second mathematical sum of each occurrence of EQUATION 3 for each block of the device. The amount of expected wear or usage remaining in the device may be expressed as the difference between the foregoing first mathematical sum and the second mathematical sum. These and other variations may also be generally extended for use with other drives, devices, systems and the like.

As will be appreciated by those skilled in the art, the techniques herein have broad applicability and should not be limited to particular examples presented herein. As described above, the techniques herein may be used to restrict a current rate of usage or wear of a device in order to achieve a specified lifetime of the device (e.g., so that the device is expected to last or not fail prior to a particular time). As described in more detail above, the lifetime of a device may represent the MTTF for the device affecting the rate or frequency of failure and the availability of the device and system including the device. Exemplary uses of the techniques are provided herein in connection with a flash memory having a lifetime determined primarily based on wear out or usage expected prior to device failure. An embodiment, for example, may use a flash drive based on MLC technology and the techniques herein may be used to extend the lifetime of the flash drive using MLC technology to be the same as a second flash drive using SLC technology by controlling the write performance rate to the flash drives. However, as described herein, the techniques herein may be used in connection with drives based on other technologies having a primary failure due to wear out or usage.

It should also be noted that the techniques herein have been described with respect to flash drives, more generally drives of varying technologies, and more generally other components of a data storage system, computer system, network and the like. It will be appreciated that the techniques herein may also be even more generally applied for use in connection with any application, entities and systems which may or may not be related to a data storage system, data storage device, or other computer or network-related component or entity. For example, the techniques herein may be used in connection with any type of application, or system, such as a car or components thereof. For example, the techniques herein may be used to determine a desired lifetime of a car engine in which components thereof may have an expected lifetime based on mileage. A person may adjust his/her daily, weekly, and/or monthly mileage rates in order to achieve a desired lifetime for the car engine. The car engine may be one component in the system, the entire car, affecting the lifetime of the car.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method for processing requests for a device comprising:

receiving a first value indicating an expected usage of said device prior to failure of said device;

receiving a second value indicated a specified lifetime of said device, said second value being in units of time;

determining a target rate of usage for the device in accordance with said first value and said second value;

determining a current rate of usage for the device, wherein said determining, the current rate of usage includes adjusting a first current rate of usage using a predicted number of cumulative writes performed, said first current rate of usage being based on a number of observed write or erasures, said predicted number of cumulative writes performed being based on a number of bit failures observed in connection with writing to the device;

determining whether the current rate of usage is greater than the target rate of usage; and if said current rate of usage is greater than the target rate of usage, performing an action to reduce the current rate of usage for the device.

2. The method of claim 1, wherein the device is a flash memory device, the first value indicates a number of writes or erasures expected with respect to the flash memory device, or a portion thereof, prior to failure of the flash memory device, and the current usage rate is determined by measuring a number of writes or erasures performed to said device, or a portion thereof, in a given time period.

3. The method of claim 2, wherein said action includes injecting one or more time delays in connection with one or more subsequent write requests.

4. The method of claim 3, wherein, upon determining that said current rate of usage is greater than the target rate of usage, the method further comprising:

holding a write request at a host for a time prior to sending the write request to a data storage system including the device for processing.

5. The method of claim 3, wherein, the device is included in a data storage system, and, upon determining that said current rate of usage is greater than the target rate of usage, the method further comprising:

modifying an amount of a resource of a data storage system allocated for use in connection with write requests for said device.

6. The method of claim 3, wherein, upon determining that said current rate of usage is greater than the target rate of usage, the method further comprising:

delaying destaging data for a write request included in a cache to said device.

7. The method of claim 3, wherein, upon determining that said current rate of usage is greater than the target rate of usage, the method further comprising:

delaying sending a response for a write request to a host that issued said write request.

8. The method of claim 1, further comprising:

revising said first value to a revised first value that is less than said first value;

determining a revised target rate of usage for the device in accordance with said revised first value and said second value; and using said revised target rate of usage in place of said target rate of usage when performing said determining whether the current rate of usage is greater than the target rate of usage.

9. The method of claim 1, wherein said determining said current rate of usage at a first point in time for said device includes:

gathering a first set of data indicating a first characteristic of said device, said first characteristic being an indicator as to an amount of usage of said device at said first point in time;

determining, in accordance with said first set of data, a first characteristic value associated with the first characteristic; and determining, in accordance with said first, characteristic value and a set of predicted data, a usage value providing a predicted usage of said device indicating an amount of cumulative usage of said device to said first point in time.

10. The method of claim 9, wherein said usage value is used in determining said current rate of usage for the device.

11. The method of claim 10, wherein the device is a flash memory device, the first characteristic value indicates a number of errors in connection with performing erasures or writes to said device, or portion thereof, and the set of predicted data indicates a plurality of predicted number of erasures or writes performed with respect to the device, or portion thereof, in accordance with a plurality of corresponding first characteristic values.

12. The method of claim 1, wherein the method is performed for a second device that is a disk drive, the first value indicates a number of times the device is expected to be spun up and/or spun down prior to failure, and the current usage rate indicates a number of times the device has been spun up and/or down in a given time period.

13. The method of claim 1, wherein said second value is used in determining a numeric value representing an availability of a data storage system including said device.

14. The method of claim 13, wherein said second value represents a mean time to fail for said device.

15. The method of claim 13, wherein said second value represents a mean time between failures for said device.

16. The method of claim 2, wherein said action includes at least one of: decreasing a rate at which erasures are performed with respect to said device, or portion thereof, and decreasing a rate at which writes are performed with respect to said device, or portion thereof.

17. A data storage system comprising:

a first flash memory device wherein a number of writes or erasures W1 is expected to be performed to the first flash memory device prior to failure of said first flash memory device;

a second flash memory device wherein a number of writes or erasures W2 is expected to be performed to the second flash memory device prior to failure of said second flash memory device, W2>W1;

a first computer readable storage medium comprising executable code stored thereon for determining target performance rates for said first flash memory device and said second flash memory device so that said first flash memory device and said second flash memory device have a same specified lifetime, said first computer readable storage medium comprising executable code stored thereon for:

determining a first target performance rate for said first flash memory device n accordance with W1 and a value indicating a specified lifetime in units of time; and determining a second target performance rate for said second flash memory device in accordance with W2 and said value indicating a specified lifetime in units of time; and a second computer readable storage medium comprising executable code stored thereon for:

determining a current performance rate for one of said first flash memory device and said second flash memory device, wherein said, determining the current performance rate includes adjusting a first current rate of usage for said one flash memory device using a predicted number of cumulative writes performed, the first current rate of usage being based on a number of observed write or erasures, the predicted number of cumulative writes performed being based on a number of bit failures observed in connection with writing to said one flash memory device;

determining whether said current performance rate for said one flash memory device is greater than a corresponding one of the first and the second target performance rates for said one flash memory device; and if said current performance rate is greater than the corresponding target performance rate, performing an action to reduce the current performance rate.

18. The data storage system of claim 17, wherein said action includes at least one of decreasing a rate at which erasures are performed with respect to said one flash memory device, or portion thereof, and decreasing a rate at which writes are performed with respect to said one flash memory device, or portion thereof.

19. A method for obtaining a desired lifetime of an entity comprising:

receiving a first value indicating an expected usage of said entity prior to failure of said entity;

receiving a second value indicated a specified lifetime of said entity, said second value being in units of time;

determining a target rate of usage for the entity in accordance with said first value and said second value;

determining a current rate of usage for the entity, wherein said determining the current rate of usage includes adjusting a first current rate of usage using a predicted number of cumulative writes performed, said first current rate of usage being based on a number of observed write or erasures, said predicted number of cumulative writes performed being based on a number of bit failures observed in connection with writing to the entity;

determining whether the current rate of usage is greater than the target rate of usage; and if said current rate of usage is greater than the target rate of usage, performing an action to reduce the current rate of usage for the entity.

20. The method of claim 19, wherein the entity is a first entity and the steps of said method are performed for said first entity and the method steps are performed for a second entity so that said first entity and said second entity have said specified lifetime.

* * * * *